United States Patent [19]

Daigaku

[11] 4,401,358
[45] Aug. 30, 1983

[54] DEVICE FOR PREVENTING ERRONEOUS INSERTION OF A PLURALITY OF PRINT SUBSTRATES INTO CORRESPONDING CONNECTORS IN A RACK

[75] Inventor: Masaaki Daigaku, Hachioji, Japan

[73] Assignee: Olympus Optical Co. Ltd., Tokyo, Japan

[21] Appl. No.: 210,363

[22] Filed: Nov. 25, 1980

[30] Foreign Application Priority Data

Jan. 14, 1980 [JP] Japan ............................... 55-2824[U]

[51] Int. Cl.³ .......................... H01R 3/00; H05K 1/14
[52] U.S. Cl. .............................. 339/113 L; 339/17 M; 339/186 M
[58] Field of Search ........... 339/17 M, 184 R, 184 M, 339/186 R, 186 M, 75 M, 75 MP; 361/412, 415

[56] References Cited

U.S. PATENT DOCUMENTS 2,946,033  7/1960  Wirth ..................... 339/184 M X
3,191,095  6/1965  Hefti ...................... 339/184 M X
3,614,714  10/1971  Silverstein .................. 339/186 M

*Primary Examiner*—Eugene F. Desmond
*Attorney, Agent, or Firm*—Parkhurst & Oliff

[57] ABSTRACT

A device for preventing erroneous insertion of a plurality of print substrates into corresponding connectors in a rack, comprising engagement mechanisms detachably mounted on respective print substrates and having engagement portions adapted to be snugly engaged with corresponding portions of adjacent engagement mechanisms only when the print substrates are correctly inserted into corresponding connectors in the rack.

5 Claims, 10 Drawing Figures

DEVICE FOR PREVENTING ERRONEOUS INSERTION OF A PLURALITY OF PRINT SUBSTRATES INTO CORRESPONDING CONNECTORS IN A RACK

BACKGROUND OF THE INVENTION

1. Field of the Invention

This invention relates to a device for preventing erroneous insertion of a plurality of print substrates into corresponding connectors in a rack.

2. Description of the Prior Art

In the case of inserting a plurality of print substrates into corresponding connectors in a rack and constructing a unit or removing the print substrates from the connectors for the purpose of effecting inspection, repair or the like thereof and then treating and subsequently inserting these print substrates again into the corresponding connectors, these print substrates are the same in shape with each other, so that there is a risk of each print substrate being erroneously inserted into a connector other than the corresponding connector. As a result, electronic parts and elements mounted on the print substrate become subjected to unexpected short-circuit or the like or troubles are induced in an electric circuit printed on the other print substrate.

In the case of inserting a plurality of print substrates into corresponding connectors provided in a rack, following measures have been made to overcome the above mentioned problem, that is, (1) Connectors and print substrates corresponding with each other are provided beforehand with numbers, marks or the like and after confirming these numbers, marks or the like each print substrate is inserted into corresponding connector in the rack, and (2) Corresponding connector and print substrate are memorized and then the print substrates are inserted into the connectors in succession.

But, after the print substrates have been subjected to treatments such as adjustment, inspection, repair or the like, if confirmation to be taken in the above mentioned measures (1) and (2) is neglected, electronic parts mounted on the print substrates are subjected to short-circuits and unnecessary voltages, thereby burning the electronic elements into damage and inducing troubles to the electric circuit printed on the other print substrates.

In order to eliminate the above mentioned drawback, a device for optically detecting erroneous insertion of a plurality of print substrates into connectors in a rack has been proposed. In this device, respective print substrates are provided at their rear end portions as viewed in their inserting direction with openings which are aligned with each other when respective print substrates are correctly inserted into corresponding connectors in the rack. At the left and right sides of the rack are arranged a light emitting element and light receiving element opposed to the openings of the print substrates concerned. After all of the print substrates are correctly inserted into the corresponding connectors in the rack, the openings are aligned with each other and light emitted from the light emitting element passes through the openings in respective print substrates to the light receiving element to turn on a lamp connected thereto. On the contrary, if the lamp is not turned on, it shows that the erroneous insertion of the print substrates is present. But, such conventional device has the disadvantage that the erroneous insertion of the print substrates could not be detected unless all of the print substrates have been inserted into corresponding connectors in the rack and hence it is impossible to ascertain whether or not print substrates are correctly inserted into corresponding connector one by one, whereby electronic parts mounted on the print substrates become burnt into damage and there occurs troubles in electric circuits printed on the other print substrate, and that if the erroneous insertion is detected, all of the print substrates must be removed from the rack and then inserted again into corresponding connectors and hence the device is troublesome in operation.

SUMMARY OF THE INVENTION

An object of the invention, therefore, is to provide a device for preventing erroneous insertion of a plurality of print substrates into corresponding connectors in a rack, which can eliminate the above mentioned drawbacks which have been encountered with the prior art techniques, which can discriminate whether or not the print substrates are correctly inserted into corresponding connectors one by one in an easy and rapid manner and which can ensure a reliable operation of the print substrate after it has been subjected to treatments such as assembly, check, repair, adjustment or the like.

A feature of the invention is the provision in a device for preventing an erroneous insertion of a plurality of print substrates into corresponding connectors in a rack, comprising a rack provided therein with connectors and a plurality of print substrates adapted to be inserted into corresponding connectors in the rack, of the improvement comprising engagement mechanisms detachably mounted on respective print substrates and having engagement portions, the engagement portions of each engagement mechanism being snugly engaged with corresponding engagement portions of adjacent engagement mechanism only when the print substrates are correctly inserted into corresponding connectors in the rack.

Further objects and features of the invention will be fully understood from the following detailed description with reference to the accompanying drawings, wherein:

DETAILED DESCRIPTION OF THE PREFERRED EMBODIMENTS

Figure 1:
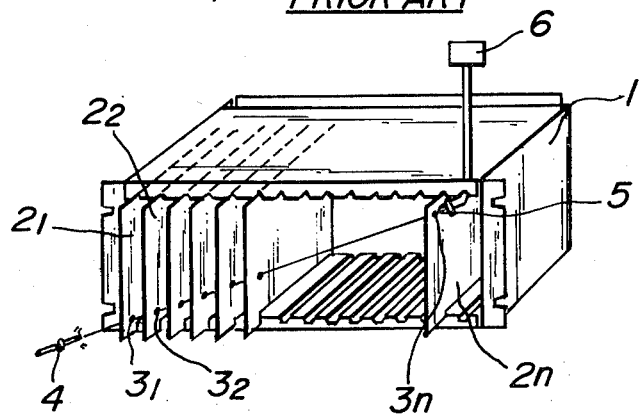
FIG. 1 is a perspective view of a conventional device for preventing an erroneous insertion of a plurality of print substrates into corrresponding connectors in a rack.

FIG. 1 shows one example of a conventional device for preventing an erroneous insertion of a plurality of print substrates into corresponding connectors in a rack. The device functions to optically detect whether or not a plurality of print substrates $2_1$ to $2_n$ are correctly inserted into corresponding connectors in a rack 1. The print substrates $2_1$ to $2_n$ are provided at their rear end portions as viewed in the inserting direction thereof with openings $3_1$ to $3_n$, respectively. To the print substrate $2_1$ is opposed a light emitting element 4 arranged outside thereof. To the print substrate $2_n$ is opposed a light receiving element 5 arranged outside thereof and connected to a lamp 6. The openings $3_1$ to $3_n$ are aligned with each other such that after all of the print substrates $2_1$ to $2_n$ are correctly inserted into the corresponding connectors in the rack 1, the light emitted from the light emitting element 4 passes through the openings $3_1$ to $3_n$ to the light receiving element 5 to turn on the lamp 6 and that after all of the print substrates $2_1$ to $2_n$ are erroneously inserted into the connectors in the rack 1, the light emitted from the light emitting element 4 is interrupted by the erroneously inserted print substrate to turn off the lamp 6. Thus, it is possible to detect the correct or erroneous insertion of the print substrates $2_1$ to $2_n$ by the on-or off-condition of the lamp 6.

Such conventional device has the disadvantages that the erroneous insertion of the print substrates $2_1$ to $2_n$ into the connectors in the rack 1 can only be detected after all of the print substrates $2_1$ to $2_n$ have been inserted into the connectors in the rack 1, so that it is impossible to ascertain whether or not the print substrates are correctly inserted into the corresponding connectors in the rack 1 one by one, and as a result, electronic parts mounted on the print substrates are burnt to damage and troubles are induced into print circuits printed on adjacent print substrate, and that, when the erroneous insertion is detected, all of the print substrates must be inserted again into the connectors in the rack and hence the device is troublesome in operation.

Figure 2:
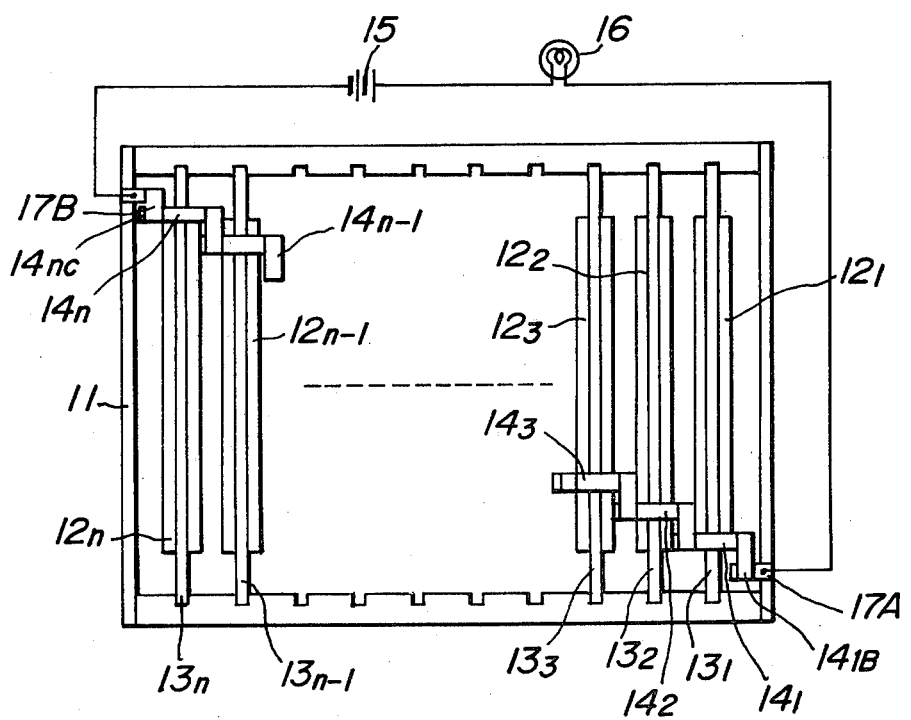
FIG. 2 is a front elevational view of one embodiment of a device for preventing an erroneous insertion of a plurality of print substrates into corresponding connectors in a rack according to the invention.

FIG. 2 shows one embodiment of a device for preventing an erroneous insertion of a plurality of print substrates into corresponding connectors in a rack according to the invention. In the present embodiment, a rack 11 is provided therein with a plurality of connectors $12_1$ to $12_n$ spaced apart from each other and extending in parallel with each other in a longitudinal direction. In these connectors $12_1$ to $12_n$ in the rack 11 are inserted a plurality of print substrates $13_1$ to $13_n$ in succession in the order as mentioned above.

Each print substrate is provided at its rear end portion as viewed in the inserting direction thereof with an engagement mechanism 14 adapted to detachably connect adjacent print substrates with each other.

In addition, provision is made of a loop circuit including an electric source 15 and a lamp and arranged outside the rack 11. The loop circuit is closed when all of the print substrates $13_1$ to $13_n$ are correctly inserted into corresponding connectors $12_1$ to $12_n$, respectively, to turn on the lamp 16.

Figure 3:
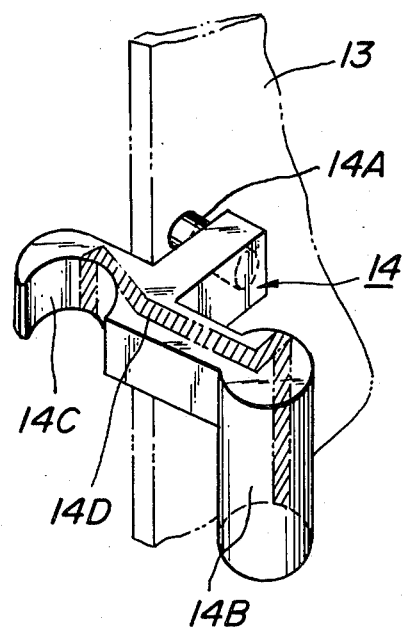
FIG. 3 is an enlarged perspective view of an engagement mechanism shown in FIG. 2.

FIG. 3 shows one engagement mechanism 14 in an enlarged scale. The engagement mechanism 14 is provided at its rear end portion as viewed in the inserting direction of the print substrate 13 (shown by dot-dash lines) with a set pin 14A made integral therewith and provided at its front end portion with a rod-shaped engagement portion 14B and a semi-circular engagement portion 14C. These engagement portions 14B and 14C are adapted to be snugly and detachably engaged with corresponding engagement portions of the engagement mechanism secured to adjacent print substrates.

All of the engagement mechanisms 14 may be made of the same in shape and may be formed of electrical conductive material, plastic material or the like. In addition, each of the engagement mechanism 14 may be made into one integral body.

If the engagement mechanism 14 is formed of an insulating material such as plastics or the like, the engagement mechanism 14 is provided with an electrically conductive pattern 14D extending from the rod-shaped engagement portion 14B to the semi-circular engagement portion 14C. The electrically conductive pattern 14D functions to electrically connect all of the engagement mechanisms $14_1$ to $14_n$ provided in adjacent print substrates $13_1$ to $13_n$ in series.

Figure 4A:
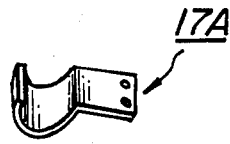
FIG. 4A is a perspective view of a semi-circular electrically conductive terminal member shown in FIG. 2.
Figure 4B:
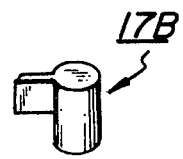
FIG. 4B is a perspective view of a rod-shaped electrically conductive terminal member shown in FIG. 2.

As shown in FIG. 2, to the rack 11 is secured a semi-circular electrically conductive terminal member 17A shown in FIG. 4A and adapted to be engaged with the rod-shaped engagement portion $14_1$B of the engagement mechanism $14_1$ mounted on the print substrate $13_1$. In addition, on the rack 11 is detachably or rotatably mounted a rod-shaped electrically conductive terminal member 17B shown in FIG. 4B and adapted to be engaged with the semi-circular engagement portion $14_n$C of the engagement mechanism $14_n$ mounted on the print substrate $13_n$. The semi-circular electrically conductive terminal member 17A is connected through the lamp 16 and electric source 15 to the rod-shaped electrically conductive terminal member 17B.

Figure 5A:
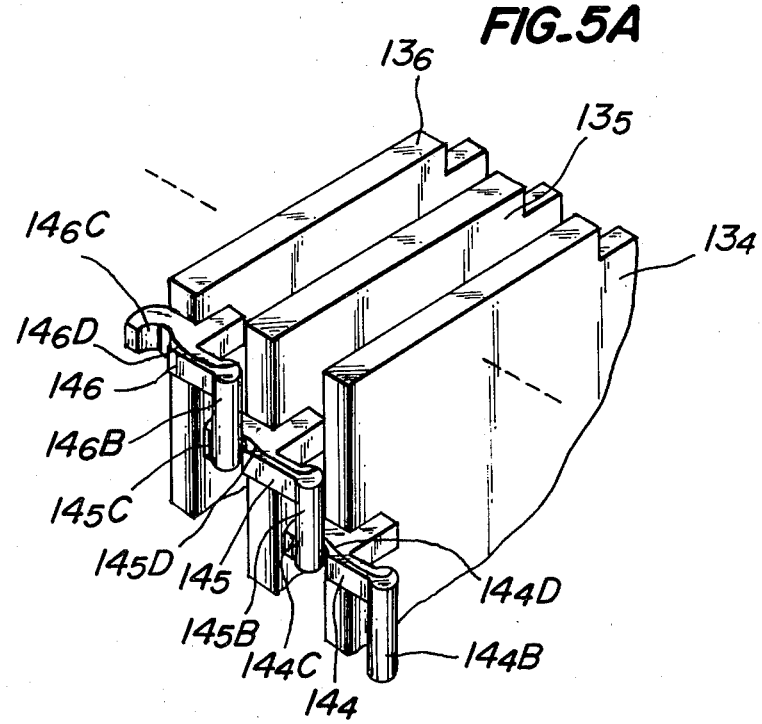
FIG. 5A is a partial perspective view of a connection condition of adjacent print substrates shown in FIG. 2 when these print substrates are correctly inserted into corresponding connectors in a rack.
Figure 5B:
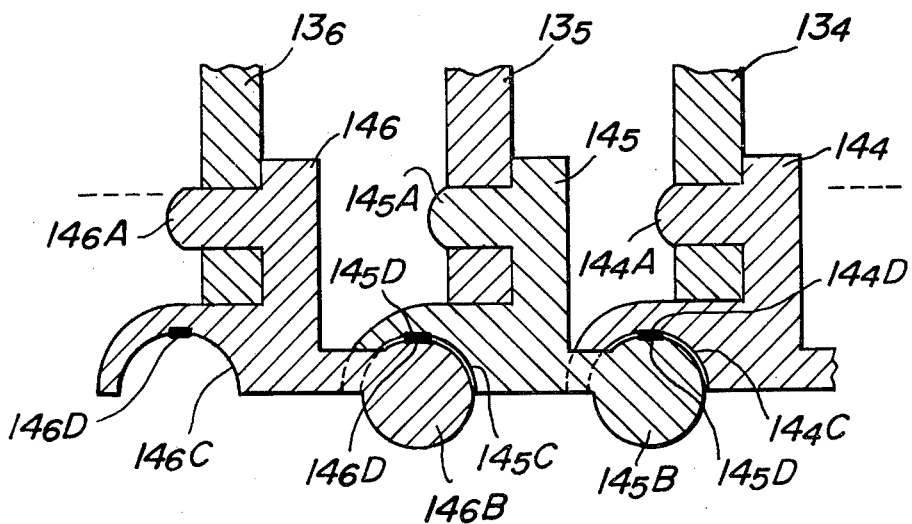
FIG. 5B is a partial cross-sectional view of the connection condition shown in FIG. 5A.
Figure 6:
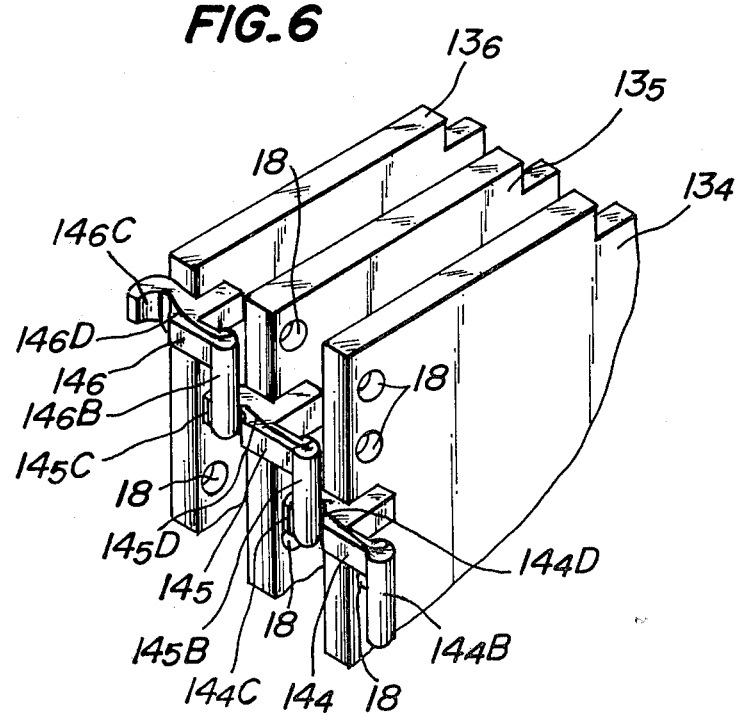
FIG. 6 is a partial perspective view of essential parts of another embodiment of a device for preventing an erroneous insertion of a plurality of print substrates into corresponding connectors in a rack according to the invention.

In the present embodiment, the print substrates $13_1$ to $13_n$ are inserted in succession into the corresponding connectors $12_1$ to $12_n$ in the rack 11 in the order as mentioned above. In this case, if each print substrate is correctly inserted into its corresponding connector in the rack 11, for example, the rod-shaped engagement portion $14_5$B of the engagement mechanism $14_5$ mounted on the print substrate $13_5$ engages with the semi-circular engagement portion $14_4$C of the engagement mechanism $14_4$ mounted on the preceding print substrate $13_4$ which has already been inserted into its corresponding connector $12_4$ in the rack 11 and the rod-shaped engagement portion $14_6$B of the engagement mechanism $14_6$ mounted on the succeeding print substrate $13_6$ engages with the semi-circular engagement portion $14_5$C of the engagement mechanism $14_5$ mounted on the print substrate $13_5$ as shown in FIG. 5A in perspective view and shown in FIG. 5B in cross-sectional view, thereby connecting adjacent print substrates in succession through the engagement mechanisms.

After the final print substrate 13$_n$ has been inserted into its corresponding connector 12$_n$ provided in the rack 11, the rod-shaped electrically conductive terminal member 17B is moved along the rack 11 to a given position and brought into engagement with the semi-circular engagement portion 14$_n$C of the engagement mechanism 14$_n$, thereby turning on the lamp 16. As a result, it is possible to detect the fact that all of the print substrates 13$_1$ to 13$_n$ are correctly inserted into corresponding connectors 12$_1$ to 12$_n$, respectively, in the rack 11. Thus, it is possible to effectively prevent absence of any print substrate in its corresponding connector provided in the rack 11.

If the print substrate is inserted into an erroneous connector in the rack 11, the engagement mechanism of the print substrate thus inserted does not engage with the engagement mechanism of the preceding print substrate which has been inserted into its corresponding connector in the rack 11. As a result, it is possible to discriminate whether or not the erroneous insertion of the print substrate is present. That is, correct or erroneous insertion of the print substrate one by one into the corresponding connector in the rack 11 can easily and rapidly be ascertained.

If a clearance formed between the engagement portions of adjacent engagement mechanisms is determined such that an operator can hear the click sound produced when the engagement portions of adjacent engagement mechanisms are brought into engagement, it is possible to discriminate whether or not the insertion of the print substrate is correct in a more reliable manner.

It is desirous to change the position of the connectors in the rack 11 into which is inserted the print substrate dependent on a unit composed of the print substrates 13$_1$ to 13$_n$. In such a case, each print substrate is provided along its front side edge portion as viewed in the inserting direction thereof with a plurality of openings 18 equidistantly spaced apart from each other and adapted to receive the set pin 14A projected from the engagement mechanism 14 shown in FIG. 3. The use of such measure ensures an easy interchange of the insertion position of the print substrate.

The invention is not limited to the above described embodiments only, but various changes and modifications may be made. For example, in the above described embodiment, the lamp 16 is turned on when all of the print substrates are correctly inserted into corresponding connectors provided in the rack 11 so as to notify the operator that all of the print substrates are correctly inserted into their corresponding connectors in the rack 11. In this case, the signal produced causes current delivered from the electric source 15 and various kinds of signals to be supplied to the connectors 12$_1$ to 12$_n$.

If the engagement mechanisms 14$_1$ to 14$_n$ are arranged such that these mechanisms can be observed by naked eyes, it is possible to discriminate whether or not all of the print substrates 13$_1$ to 13$_n$ are correctly inserted into their corresponding connectors 12$_1$ to 12$_n$ in the rack 11.

Figure 7:
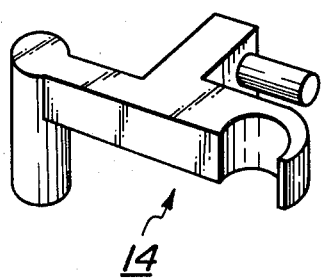
FIG. 7 is a perspective view of another embodiment of an engagement mechanism according to the invention.
Figure 8:
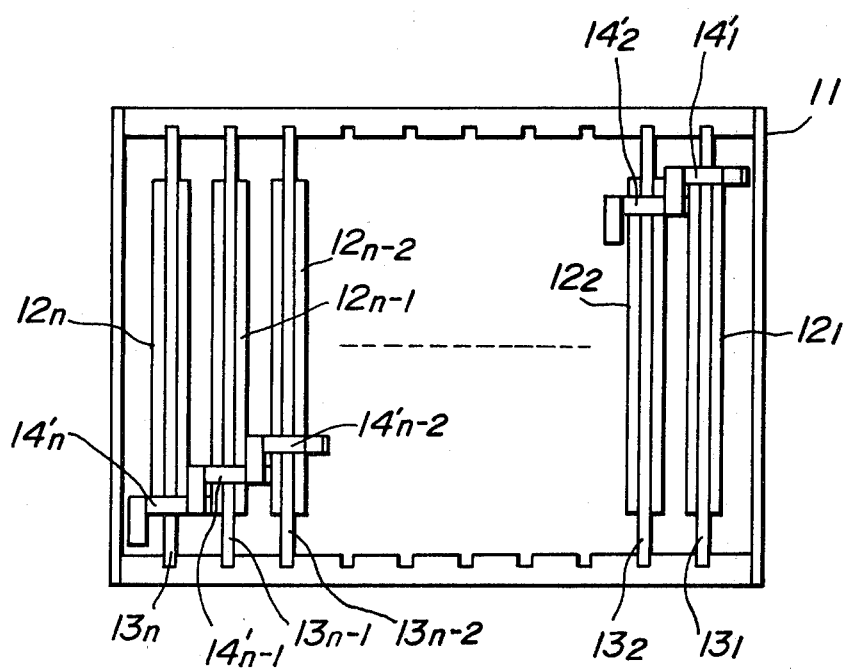
FIG. 8 is a front elevational view of another embodiment of a device for preventing an erroneous insertion of a plurality of print substrates into corresponding connectors in a rack according to the invention.

Alternatively, if use is made of an engagement mechanism 14' shown in FIG. 7 and having a shape which is reverse to that of the engagement mechanism 14 shown in FIG. 3, the arrangement of the engagement mechanisms 14'$_1$ to 14'$_n$ may be reversed as shown in FIG. 8. In this case, the print substrates 13$_1$ to 13$_n$ are inserted into the corresponding connectors 12$_1$ to 12$_n$ in the rack 11 in the order which is opposite to that described with reference to FIG. 2.

In the above described embodiment, the print substrate 13 is provided at its rear end portion as viewed in its inserting direction with the engagement mechanism 14, but the engagement mechanism may be located at any side edge portion of the print substrate. In addition, the shape of the engagement mechanism may be changed from those shown in FIGS. 3 and 7 to various shapes. For example, the engagement mechanism may be provided at the rear end portion as viewed in the inserting direction of the print substrate with a set pin and the print substrate may be provided at that rear end portion thereof which is adjacent to said set pin with a depression to be engaged with said set pin.

As stated hereinbefore, the invention is capable of discriminating correct or erroneous insertion of respective print substrates into the corresponding connectors in the rack in a simple and easy manner, thereby effectively attaining various objects of the invention.

What is claimed is:

1. An apparatus for preventing the erroneous insertion of a plurality of print substrates into corresponding connectors in a rack, comprising a rack provided with connectors and a plurality of print substrates adapted to be inserted into their respective connectors in the rack, wherein:
   each of said print substrates is provided with an engagement mechanism detachably mounted thereon;
   each engagement mechanism is provided with an engagement portion; and
   the engagement mechanism of each print substrate is engaged with the engagement mechanism of each adjacent substrate only when the print substrates are correctly inserted into said rack.

2. An apparatus in accordance with claim 1, wherein each engagement mechanism is provided at the front end portion, as viewed along the direction of insertion of the print substrates, with a set pin detachably fitted into an opening provided in the print substrate and provided at its rear end portion, as viewed along the direction of insertion of the print substrates, with a rod-shaped engagement portion and a semi-circular engagement portion positioned apart from each other and the rod-shaped and the semi-circular engagement portions of each engagement mechanism are engaged with corresponding semi-circular and rod-shaped engagement portions of each adjacent engagement mechanism only when the print substrates are correctly inserted into said rack.

3. An apparatus in accordance with claim 1, further comprising a loop circuit including an electric source and a lamp arranged outside said rack, said loop circuit being completed when all of said print substrates are correctly inserted into their respective connectors, said lamp being lighted when said circuit is completed.

4. An apparatus in accordance with claim 1, wherein each of said engagement mechanisms are formed of an insulative material and provided with an electrically conductive pattern extending along the length of the engagement portion.

5. An apparatus in accordance with claim 1, wherein said print substrates are provided along its front side edge portion, as viewed along the direction of insertion of the print substrates, with a plurality of equally spaced openings each adapted to receive a set pin projected from one of said engagement mechanisms.

* * * * *